US010446427B2

United States Patent
Honda et al.

(10) Patent No.: US 10,446,427 B2
(45) Date of Patent: Oct. 15, 2019

(54) CONVEYANCE SYSTEM AND CONVEYANCE METHOD

(71) Applicant: MURATA MACHINERY, LTD., Kyoto-shi, Kyoto (JP)

(72) Inventors: Osamu Honda, Toyohashi (JP); Keiji Yamada, Toyohashi (JP); Takashi Nozawa, Toyohashi (JP); Daisuke Ono, Toyohashi (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 15/780,685

(22) PCT Filed: Oct. 13, 2016

(86) PCT No.: PCT/JP2016/080414
§ 371 (c)(1),
(2) Date: Jun. 1, 2018

(87) PCT Pub. No.: WO2017/098805
PCT Pub. Date: Jun. 15, 2017

(65) Prior Publication Data
US 2018/0358252 A1 Dec. 13, 2018

(30) Foreign Application Priority Data

Dec. 8, 2015 (JP) .................................. 2015-239616

(51) Int. Cl.
*H01L 21/677* (2006.01)
*B65G 43/10* (2006.01)

(52) U.S. Cl.
CPC ........ *H01L 21/67736* (2013.01); *B65G 43/10* (2013.01); *H01L 21/677* (2013.01);
(Continued)

(58) Field of Classification Search
CPC ......... H01L 21/67736; H01L 21/67724; H01L 21/67733; H01L 21/67769
See application file for complete search history.

(56) References Cited

U.S. PATENT DOCUMENTS 9,004,840 B2 * 4/2015 Kinugawa ......... H01L 21/67733
414/281
9,224,628 B2 * 12/2015 Bufano ............. H01L 21/67017
(Continued)

FOREIGN PATENT DOCUMENTS

JP 2010-067146 A 3/2010
JP 2014-057111 A 3/2014

*Primary Examiner* — Kaitlin S Joerger
(74) *Attorney, Agent, or Firm* — Keating & Bennett, LLP

(57) ABSTRACT

A conveyance system includes a track, ceiling conveyance vehicles, and a conveyance controller configured or programmed to output a conveyance instruction for a FOUP to the ceiling conveyance vehicles. When a first FOUP on a downstream port is waiting for collection, the conveyance controller waits without outputting a conveyance instruction instructing collection of the first FOUP until any of the conveyance vehicles conveying a second FOUP to an upstream port has been recognized until a waiting time set in advance has elapsed since the first FOUP changed to a state waiting for collection and outputs the conveyance instruction instructing collection of the first FOUP when the waiting time has elapsed since a point in time when the first FOUP changed to the state waiting for collection.

7 Claims, 10 Drawing Sheets

(52) U.S. Cl.
CPC .. *H01L 21/67724* (2013.01); *H01L 21/67733* (2013.01); *H01L 21/67769* (2013.01)

(56) References Cited

U.S. PATENT DOCUMENTS

| | | | |
|---|---|---|---|
| 9,230,844 B2 * | 1/2016 | Mizokawa | H01L 21/67733 |
| 9,263,311 B2 * | 2/2016 | Ota | B65G 1/0457 |
| 9,415,934 B2 * | 8/2016 | Ikeda | B66C 19/00 |
| 9,543,178 B2 * | 1/2017 | Lee | H01L 21/67294 |
| 9,548,230 B2 * | 1/2017 | Iwasaki | H01L 21/67733 |
| 9,589,821 B2 * | 3/2017 | Nishikawa | G05B 15/02 |
| 9,592,959 B2 * | 3/2017 | Kinugawa | H01L 21/67733 |
| 9,842,756 B2 * | 12/2017 | Bonora | H01L 21/67766 |
| 10,037,908 B2 * | 7/2018 | Ota | H01L 21/67733 |
| 10,043,698 B2 * | 8/2018 | Ota | B65G 1/0457 |
| 10,153,189 B2 * | 12/2018 | Takai | H01L 21/67733 |
| 10,156,794 B1 * | 12/2018 | Yu | G03F 7/70358 |
| 10,186,442 B2 * | 1/2019 | Takai | H01L 21/67733 |
| 10,242,900 B2 * | 3/2019 | Michishita | H01L 21/67769 |
| 10,256,129 B2 * | 4/2019 | Takai | H01L 21/67733 |
| 10,310,513 B2 * | 6/2019 | Maejima | G05D 1/0289 |
| 10,325,797 B2 * | 6/2019 | Iwasaki | H01L 21/54 |

* cited by examiner

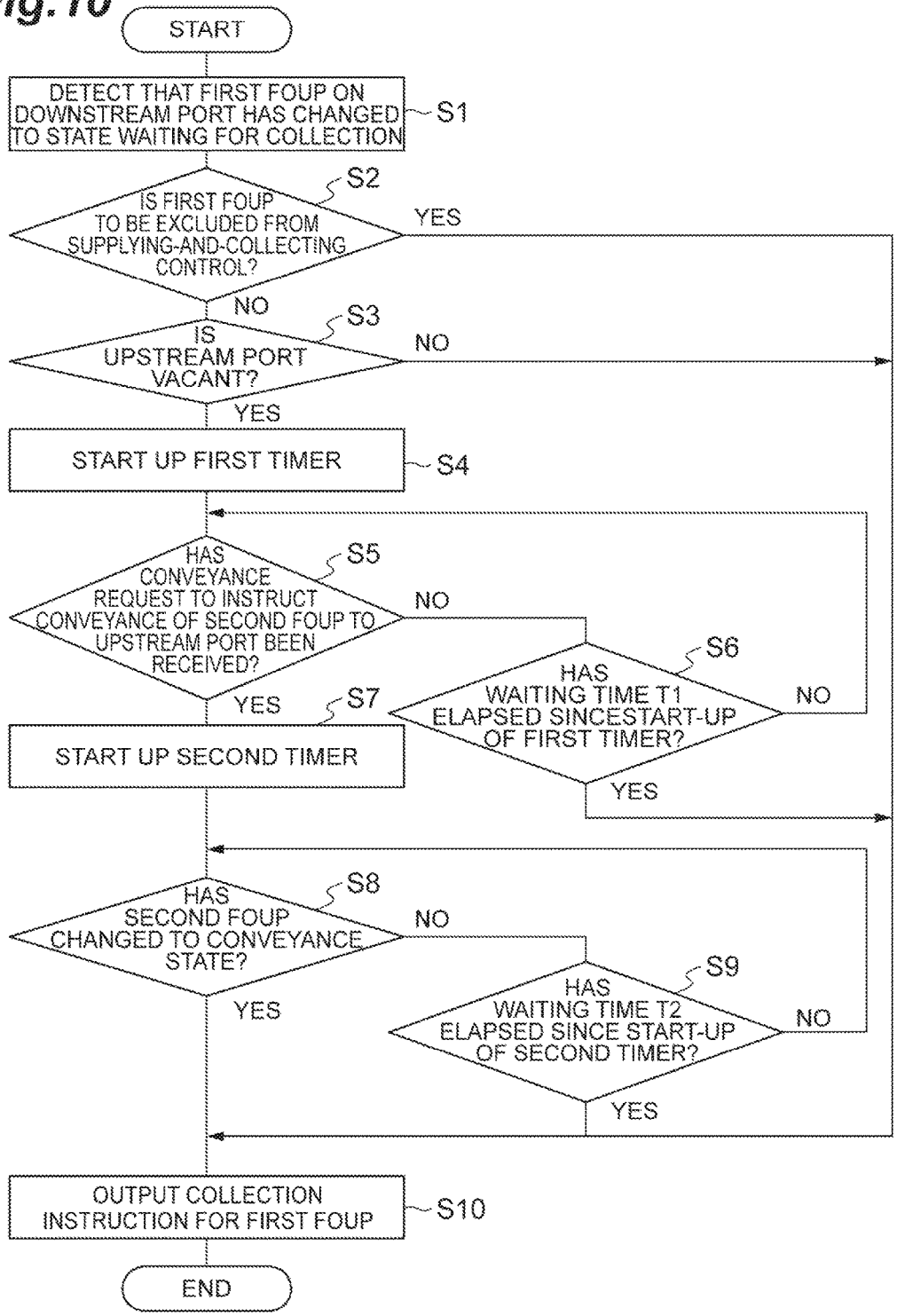

CONVEYANCE SYSTEM AND CONVEYANCE METHOD

CROSS REFERENCE TO RELATED APPLICATIONS

This application claims the benefit of priority to Japanese Patent Application No. 2015-239616 filed on Dec. 8, 2015 and is a Continuation Application of PCT Application No. PCT/JP2016/080414 filed on Oct. 13, 2016. The entire contents of each application are hereby incorporated herein by reference.

BACKGROUND OF THE INVENTION

1. Field of the Invention

The present disclosure relates to a conveyance system and a conveyance method.

2. Description of the Related Art

A system is known that causes a ceiling conveyance vehicle to execute supply of a conveyed object to a processing apparatus and collection of a processed conveyed object from the processing apparatus as a conveyance system used for semiconductor manufacturing factories, for example. In such a conveyance system, a configuration is known that provides a temporary placement base on an upstream side of an apparatus port in a travel direction of the ceiling conveyance vehicle, for example (refer to Japanese Unexamined Patent Publication No. 2014-57111).

In such a configuration, the ceiling conveyance vehicle that has placed the conveyed object on the temporary placement base can collect the processed conveyed object placed on the apparatus port on a downstream side (a supplying-and-collecting operation). When such a supplying-and-collecting operation has been established, one ceiling conveyance vehicle can be caused to execute supply and collection of the conveyed object to and from the processing apparatus, and thereby the operating efficiency of the ceiling conveyance vehicle can be improved.

SUMMARY OF THE INVENTION

However, the supplying-and-collecting operation described above has been conventionally nothing more than accidentally established when a ceiling traveling vehicle conveying a conveyed object toward the temporary placement base appears when a conveyed object waiting for collection is present on the apparatus port. Consequently, the possibility for the supplying-and-collecting operation to be established is low.

Preferred embodiments of the present invention provide conveyance systems and conveyance methods that increase the possibility for the supplying-and-collecting operation to be established while significantly reducing or preventing degradation in conveyance efficiency, and improve the operating efficiency of the conveyance vehicle.

A conveyance system according to a preferred embodiment of the present invention includes a track, a plurality of conveyance vehicles traveling along the track and each conveying a conveyed object, and a controller configured or programmed to output a conveyance instruction for the conveyed object to the conveyance vehicles. When a first conveyed object placed on a downstream port, which is a place capable of accommodating the conveyed object thereon, is in a state waiting for collection, and when the conveyed object is not placed on an upstream port, which is a place on an upstream side of the downstream port in a travel direction of the conveyance vehicles and capable of accommodating the conveyed object thereon, the controller waits without outputting a conveyance instruction instructing collection of the first conveyed object until any of the conveyance vehicles conveying a second conveyed object to the upstream port has been recognized until a waiting time set in advance has elapsed since the first conveyed object changed to the state waiting for collection and outputs the conveyance instruction instructing collection of the first conveyed object when the waiting time has elapsed since a point in time when the first conveyed object changed to the state waiting for collection.

In the conveyance system, the controller waits without outputting the conveyance instruction (a collection instruction) instructing collection of the first conveyed object in the state waiting for collection on the downstream port until the conveyance vehicle conveying the second conveyed object to the upstream port has been recognized within the waiting time set in advance. The collection instruction for the first conveyed object is thus output after the conveyance vehicle conveying the second conveyed object to the upstream port has been recognized, such that the possibility for the collection instruction for the first conveyed object to be allocated to the conveyance vehicle conveying the second conveyed object is able to be increased. Consequently, the possibility for a supplying-and-collecting operation that collects the first conveyed object by the conveyance vehicle that has placed the second conveyed object on the upstream port to be established is increased. In addition, the waiting time during which output of the collection instruction is able to be waited for is set in advance, such that degradation in conveyance efficiency caused by continuation of waiting without outputting the collection instruction is able to be significantly reduced or prevented. Consequently, the conveyance system increases the possibility for the supplying-and-collecting operation to be established while significantly reducing or preventing degradation in conveyance efficiency and improves the operating efficiency of the conveyance vehicles.

In the conveyance system, the controller may be configured or programmed to output the conveyance instruction for the conveyed object based on a conveyance request for the conveyed object received from a host controller, and the controller may output the conveyance instruction instructing collection of the first conveyed object when not receiving a conveyance request to instruct conveyance of the second conveyed object to the upstream port from the host controller by the time a first waiting time set in advance has elapsed since the first conveyed object changed to the state waiting for collection. When the time until the conveyance request for the second conveyed object has been received from the host controller is prolonged, the time for the conveyance vehicle that is able to execute the supplying-and-collecting operation to collect the first conveyed object is also delayed accordingly. Given these circumstances, in the conveyance system, when the time until the conveyance request to instruct conveyance of the second conveyed object to the upstream port has been received since the first conveyed object changed to the state waiting for collection exceeds the first waiting time, the collection instruction is output. With this operation, degradation in conveyance efficiency caused by continuation of waiting without outputting the collection instruction is able to be appropriately reduced or prevented.

In the conveyance system, the controller may output the conveyance instruction instructing collection of the first conveyed object when the second conveyed object has not changed to a conveyance state to be conveyed by any of the conveyance vehicles by the time a second waiting time set in advance has elapsed since the conveyance request to instruct conveyance of the second conveyed object to the upstream port was received from the host controller. When the time until the second conveyed object has changed to the conveyance state since the conveyance request to instruct conveyance of the second conveyed object to the upstream port was received from the host controller is prolonged, the time for the ceiling conveyance vehicle that is able to execute the supplying-and-collecting operation to collect the first conveyed object is also delayed accordingly. Given these circumstances, in the conveyance system, when the time until the second conveyed object has changed to the conveyance state since the conveyance request to instruct conveyance of the second conveyed object to the upstream port was received from the host controller exceeds the second waiting time, the collection instruction is output. With this operation, degradation in conveyance efficiency caused by continuation of waiting without outputting the collection instruction is appropriately reduced or prevented.

The conveyance system may further include a storage apparatus including a storage part to and from which any of the conveyance vehicles is capable of delivering the conveyed object and a transfer mechanism capable of transferring the conveyed object between the storage part and an apparatus port to and from which any of the conveyance vehicles is capable of delivering the conveyed object, the storage part may include a first storage part provided on an upstream side of the apparatus port in the travel direction of the conveyance vehicles and a second storage part provided on a downstream side of the apparatus port in the travel direction of the conveyance vehicles, the downstream port may be the apparatus port or the second storage part, the upstream port may be the first storage part when the downstream port is the apparatus port and may be the first storage part or the apparatus port when the downstream port is the second storage part, and the controller may be configured or programmed to further output a conveyance instruction for the conveyed object to the transfer mechanism to output a conveyance instruction instructing transfer of the first conveyed object to the downstream port to the transfer mechanism when the downstream port is vacant, and when the first conveyed object is placed on the upstream port. With the configuration, transfer of the conveyed object from the upstream port (the first storage part or the apparatus port) to the downstream port (the apparatus port or the second storage part) is performed by the transfer mechanism, such that a situation that enables the supplying-and-collecting operation to be executed is intentionally created.

In the conveyance system, when a degree of priority of conveyance of the first conveyed object is higher than a standard set in advance, the controller may output the conveyance instruction instructing collection of the first conveyed object at a point in time when the first conveyed object has changed to the state waiting for collection. With the conveyance system, the conveyed object with a high degree of priority of conveyance is excluded from execution of the control waiting without outputting the collection instruction in order to increase the possibility for the supplying-and-collecting operation to be established (the supplying-and-collecting control) and is able to be immediately conveyed. With this operation, the supplying-and-collecting control is able to be appropriately executed while requirements for the first conveyed object are satisfied.

In the conveyance system, when a next conveyance destination of the first conveyed object is a specific conveyance destination set in advance, the controller may output the conveyance instruction instructing collection of the first conveyed object at a point in time when the first conveyed object has changed to the state waiting for collection. With the conveyance system, a conveyance destination for which conveyance is required to be hastened is set as the specific conveyance destination in advance, for example, such that the conveyed object with such a specific conveyance destination as the next conveyance destination is excluded from the execution of the supplying-and-collecting control and is able to be immediately conveyed. With this operation, the supplying-and-collecting control is able to be appropriately executed while requirements for the first conveyed object are satisfied.

A conveyance method according to a preferred embodiment of the present invention is a conveyance method performed by the controller in the conveyance system, the conveyance method including a first step for detecting that the first conveyed object placed on the downstream port has changed to the state waiting for collection, a second step for, when it is detected that the first conveyed object has changed to the state waiting for collection at the first step, determining whether the conveyed object is placed on the upstream port, and a third step for, when it is determined that the conveyed object is not placed on the upstream port at the second step, waiting without outputting the conveyance instruction instructing collection of the first conveyed object until the conveyance vehicle conveying the second conveyed object to the upstream port has been recognized until the waiting time set in advance has elapsed since the first conveyed object changed to the state waiting for collection and outputting the conveyance instruction instructing collection of the first conveyed object when the waiting time has elapsed since the point in time when the first conveyed object changed to the state waiting for collection.

In the conveyance method, when the first conveyed object on the downstream port is in the state waiting for collection, and when the conveyed object is not placed on the upstream port, the controller waits without outputting the conveyance instruction (the collection instruction) instructing collection of the first conveyed object in the state waiting for collection on the downstream port until the conveyance vehicle conveying the second conveyed object to the upstream port has been recognized within the waiting time set in advance. With this operation, the possibility for the collection instruction for the first conveyed object to be allocated to the conveyance vehicle conveying the second conveyed object is able to be increased. Consequently, the possibility for the supplying-and-collecting operation that collects the first conveyed object by the conveyance vehicle that has placed the second conveyed object on the upstream port to be established is able to be increased. In addition, the waiting time during which output of the collection instruction can be waited for is set in advance, such that degradation in conveyance efficiency caused by continuation of waiting without outputting the collection instruction is significantly reduced or prevented. Consequently, the conveyance method increases the possibility for the supplying-and-collecting operation to be established while reducing or preventing degradation in conveyance efficiency and thus improves the operating efficiency of the conveyance vehicles.

Preferred embodiments of the present invention provide conveyance systems and methods that increase the possibility for a supplying-and-collecting operation to be established while significantly reducing or preventing degradation in conveyance efficiency to improve the operating efficiency of conveyance vehicles.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is a flowchart of an operation of the conveyance system.

DETAILED DESCRIPTION OF THE PREFERRED EMBODIMENTS

The following describes preferred embodiments of the present invention in detail with reference to the accompanying drawings. In the description of the drawings, the same or similar components are denoted by the same symbols, and a duplicate description is omitted.

Figure 1:
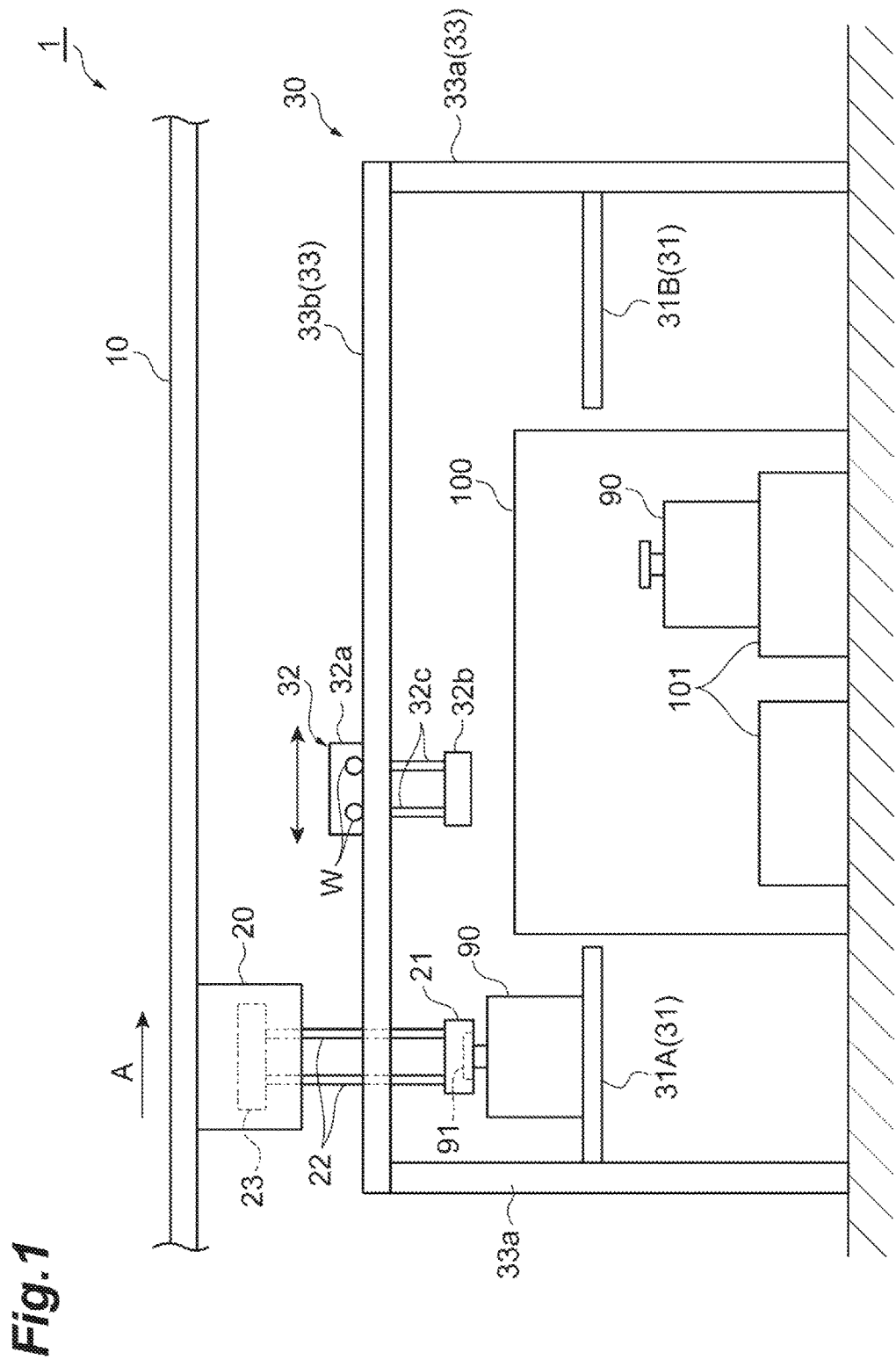
FIG. 1 is a diagram of a principal portion of a conveyance system of a preferred embodiment of the present invention.
Figure 2:
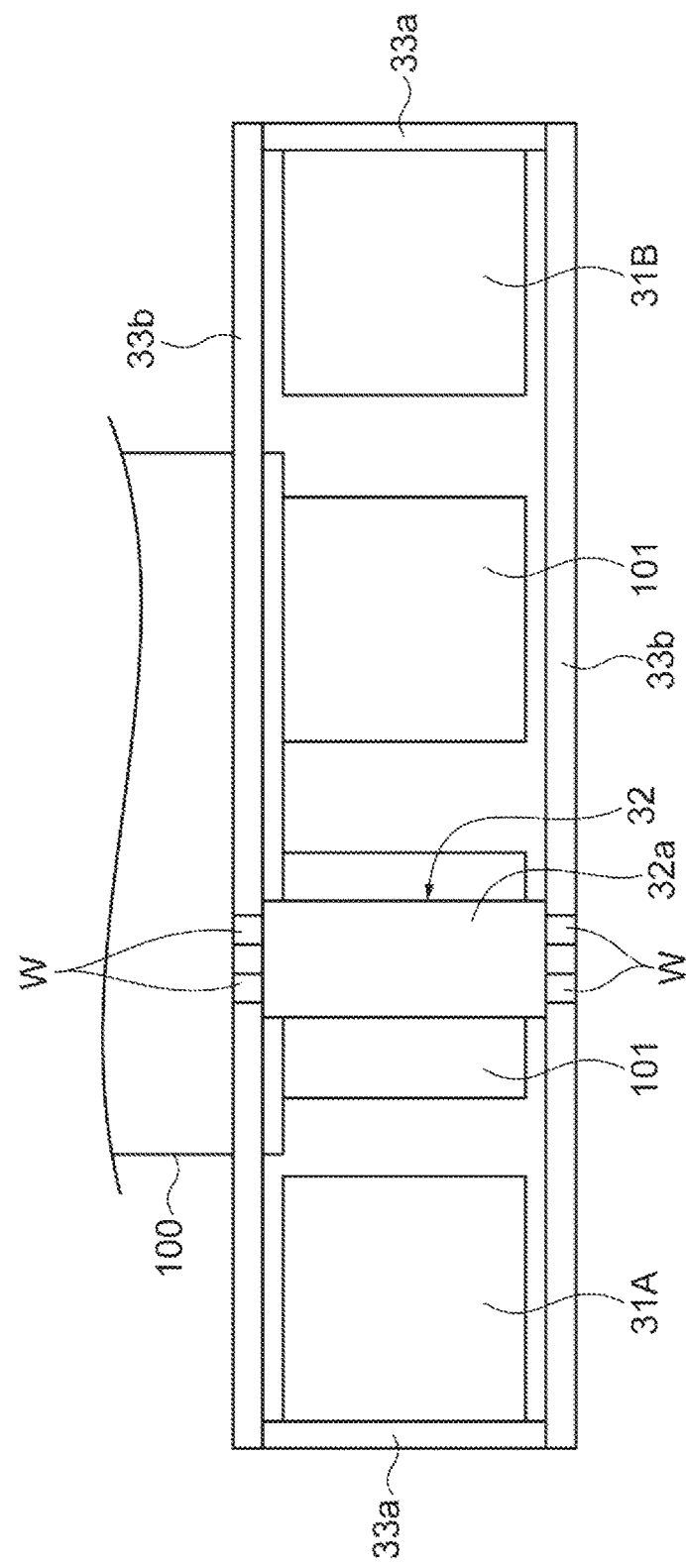
FIG. 2 is a plan view of a storage apparatus and a semiconductor processing apparatus in FIG. 1.

The following describes a conveyance system 1 of the present preferred embodiment with reference to FIG. 1 and FIG. 2. The conveyance system 1 is a system that conveys a front opening unified pod (FOUP) housing a plurality of semiconductor wafers in a semiconductor manufacturing factory including a plurality of semiconductor processing apparatuses 100. As illustrated in FIG. 1, the conveyance system 1 includes a track 10, a plurality of ceiling conveyance vehicles 20, and storage apparatuses 30 installed corresponding to the respective semiconductor processing apparatuses 100. FIG. 1 illustrates a storage apparatus 30 corresponding to one semiconductor processing apparatus 100 among the semiconductor processing apparatuses 100 present in the semiconductor manufacturing factory.

The track 10 is preferably provided near a ceiling of the semiconductor manufacturing factory. Each of the ceiling conveyance vehicles 20 is an overhead hoist transfer (OHT) vehicle. The ceiling conveyance vehicle 20 travels in one direction along the track 10 while being hung by the track 10. Hereinafter, an upstream side and a downstream side in a travel direction A of the ceiling conveyance vehicle 20 will be referred to as an "upstream side" and a "downstream side," respectively.

The ceiling conveyance vehicle 20 conveys (supplies) a FOUP 90 housing a plurality of semiconductor wafers to an apparatus port 101 of each of the semiconductor processing apparatuses 100 or a storage part 31 described below. In the present preferred embodiment, as an example, two apparatus ports 101 are provided in a row in the travel direction A of the ceiling conveyance vehicle 20 for one semiconductor processing apparatus 100. The semiconductor processing apparatus 100 performs certain processing on the semiconductor wafers and the like housed in the FOUP 90 placed on the apparatus port 101. In the following description, the processing on the semiconductor wafers and the like housed in the FOUP 90 will be referred to simply as the processing on the FOUP 90. The FOUP 90 after the processing on the semiconductor wafers and the like housed therein has been executed will be referred to as the processed FOUP 90, for example. The processed FOUP 90 is collected by the ceiling conveyance vehicle 20 to be conveyed to an apparatus port or the like of the semiconductor processing apparatus 100 performing processing at the next process, for example. The processed FOUP 90 may be collected by the ceiling conveyance vehicle 20 from the apparatus port 101 or may be once evacuated to the storage part 31 and then be collected by the ceiling conveyance vehicle 20.

The ceiling conveyance vehicle 20 has a grasping mechanism 21 capable of grasping a flange 91 of the FOUP 90 and a hoisting and lowering mechanism 23 capable of hoisting and lowering the grasping mechanism 21 by the drawing in and out of belts 22 to which the grasping mechanism 21 is connected. The ceiling conveyance vehicle 20 hoists and lowers the grasping mechanism 21 by the hoisting and lowering mechanism 23 to enable the FOUP 90 to be delivered to and from both the storage part 31 described below and the apparatus port 101.

The storage apparatus 30 includes two storage parts 31, a local vehicle (a transfer mechanism) 32, and a support member 33 supporting the storage part 31 and the local vehicle 32 as an example. The support member 33 includes a pair of side walls 33a and 33a erected on the ground so as to cause their principal surfaces to be opposite to each other in an extending direction of the track 10 and a pair of rail members 33b and 33b extending in the extending direction of the track 10 below the track 10. The pair of rail members 33b and 33b are opposite to each other in a direction orthogonal to the extending direction of the track 10 at the same height position. Respective both ends of each of the rail members 33b are supported by upper end surfaces of the pair of side walls 33a and 33a. The spacing between the rail members 33b and 33b defining a pair is set to a dimension that causes the FOUP 90 hoisted and lowered by the ceiling conveyance vehicle 20 not to interfere with the rail members 33b.

The storage part 31 is a plate-shaped member, or storage plate, horizontally extending so as to enable the FOUP 90 to be placed thereon. A first storage part 31A on the upstream side among the two storage parts 31 is fixed to a downstream side surface of the side wall 33a on the upstream side so as to be positioned on the upstream side of the two apparatus ports 101. A second storage part 31B on the downstream side among the two storage parts 31 is fixed to an upstream side surface of the side wall 33a on the downstream side so as to be positioned on the downstream side of the two apparatus ports 101.

The first storage part 31A on the upstream side defines and functions as a waiting place at which the FOUP 90 waiting for processing is caused to wait when there is no vacancy at the apparatus ports 101 (when the FOUP 90 is placed on each of the two apparatus ports 101 in the example in FIG. 1). The FOUP 90 waiting for processing is caused to wait at the first storage part 31A such that, when a vacancy occurs at any of the apparatus ports 101, the FOUP 90 waiting for processing is able to be immediately supplied to the apparatus port 101 from the first storage part 31A.

The second storage part 31B on the downstream side defines and functions as an evacuation place to which the processed FOUP 90 on which the processing by the semiconductor processing apparatus 100 has been completed is evacuated from the apparatus ports 101. The processed FOUP 90 is evacuated to the second storage part 31B, such that a situation in which the processed FOUP 90 is not collected by the ceiling conveyance vehicle 20 and remains placed on the apparatus port 101 to cause the apparatus port 101 to remain unable to be used is able to be eliminated.

The local vehicle 32 includes a vehicle body 32a on which wheels W are mounted. The local vehicle 32 includes a grasping mechanism 32b capable of grasping the flange 91 of the FOUP 90 and a hoisting and lowering mechanism (not illustrated) capable of hoisting and lowering the grasping mechanism 32b by the drawing in and out of belts 32c to which the grasping mechanism 32b is connected in the same manner as in the ceiling conveyance vehicle 20. The wheels W of the vehicle body 32a travel on the pair of rail members 33b and 33b such that the local vehicle 32 freely moves along the pair of rail members 33b and 33b. The grasping mechanism 32b is hoisted and lowered by the hoisting and lowering mechanism, such that the local vehicle 32 is able to transfer the FOUP 90 to and from the storage part 31 and the apparatus port 101.

Figure 3:
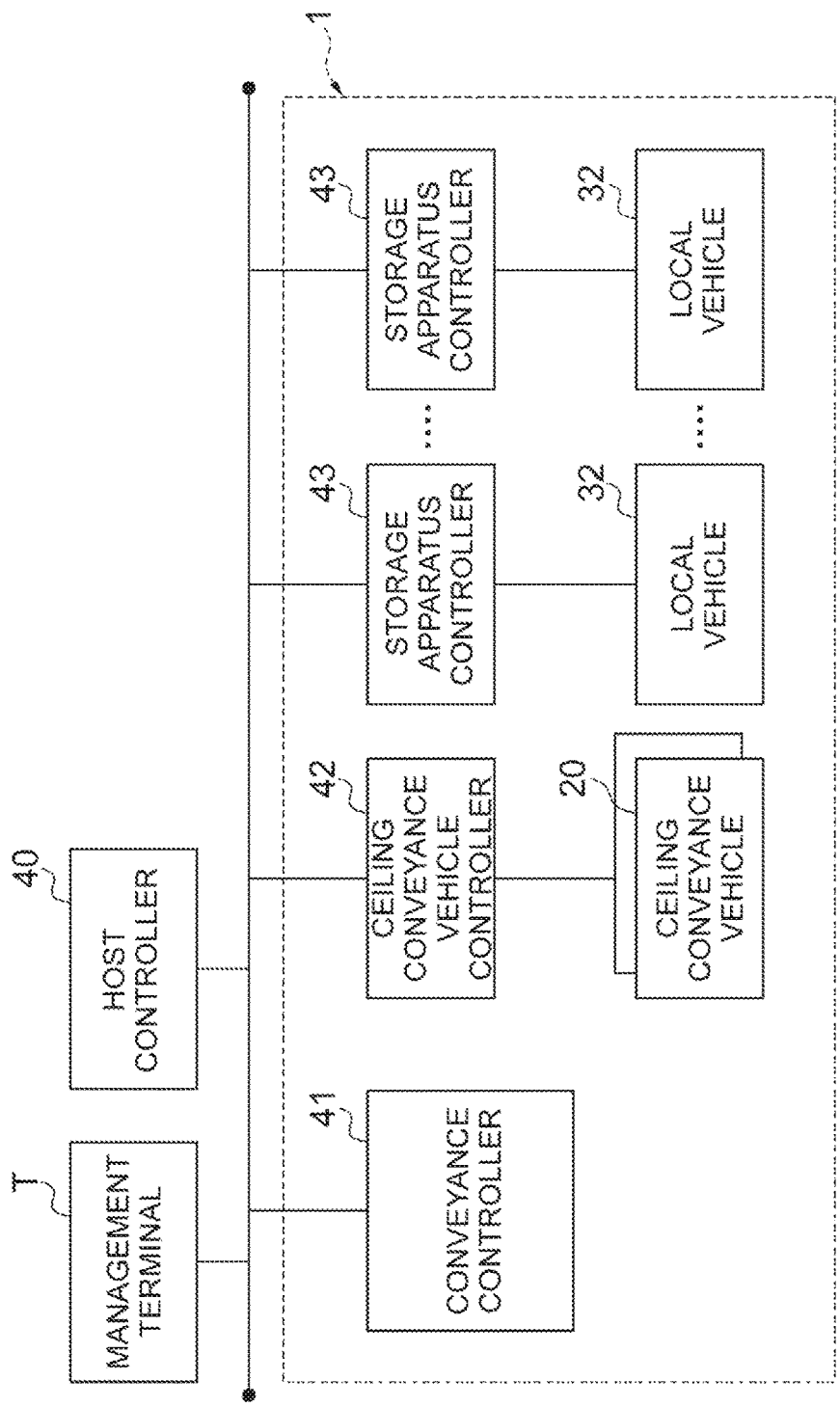
FIG. 3 is a block diagram of a control configuration of the conveyance system.

As illustrated in FIG. 3, the conveyance system 1 includes a conveyance controller 41, a ceiling conveyance vehicle controller 42 common to the ceiling conveyance vehicles 20, and a storage apparatus controller 43 provided in each of the storage apparatuses 30 as functional components managing a control system. The conveyance controller 41, the ceiling conveyance vehicle controller 42, and the storage apparatus controller 43 preferably are each a computer apparatus including a processor, a memory, a storage, and a communication device, for example. In each of the controllers, the processor executes certain software (a computer program) loaded into the memory or the like to control reading and writing of data in the memory and the storage and communication among the controllers by the communication devices to implement functions of the respective controllers described below.

The conveyance controller 41 is a controller controlling operations of the ceiling conveyance vehicles 20 and the local vehicle 32. When controlling the operation of the ceiling conveyance vehicles 20, the conveyance controller 41 outputs a conveyance instruction for the FOUP 90 to the ceiling conveyance vehicle controller 42. In other words, the conveyance controller 41 outputs, via the ceiling conveyance vehicle controller 42, the conveyance instruction for the FOUP 90 to the ceiling conveyance vehicles 20. When controlling the operation of the local vehicle 32, the conveyance controller 41 outputs a conveyance instruction for the FOUP 90 to the storage apparatus controller 43 controlling the storage apparatus 30 including the local vehicle 32. In other words, the conveyance controller 41 outputs, via the storage apparatus controller 43, the conveyance instruction for the FOUP 90 to the local vehicle 32 controlled by the storage apparatus controller 43.

The conveyance instruction is information instructing conveyance of the FOUP 90 as an object to be conveyed from a starting point (a conveyance source) to a destination (a conveyance destination). Specifically, the conveyance instruction is information in which information (ID) identifying the FOUP 90 to be conveyed, information (a From point) identifying a point (the apparatus port, the storage part, and the like) at which the FOUP 90 to be conveyed is grasped, and information (a To point) identifying a point (the apparatus port, the storage part, and the like) at which the FOUP 90 to be conveyed is unloaded are associated with each other.

The conveyance controller 41 outputs the conveyance instruction to an appropriate controller based on a combination of the From point and the To point of the conveyance instruction. Specifically, if the combination of the From point and the To point is a combination that is able to be transferred by the local vehicle 32 within the same storage apparatus 30, the conveyance controller 41 outputs the conveyance instruction to the storage apparatus controller 43 corresponding to the storage apparatus 30. In contrast, if the combination of the From point and the To point is not a combination that is able to be transferred by the local vehicle 32 within the same storage apparatus 30 (in the case of conveyance between different semiconductor processing apparatuses 100, for example), the conveyance controller 41 outputs the conveyance instruction to the ceiling conveyance vehicle controller 42.

The conveyance instruction output by the conveyance controller 41 is generated based on a conveyance request from a host controller 40. The host controller 40 monitors the entire status of the semiconductor manufacturing factory to recognize a vacancy status of the apparatus port 101 of each of the semiconductor processing apparatuses 100 and the storage part 31. The host controller 40 also recognizes a processing status of each FOUP 90. The host controller 40 preferably is a computer apparatus including a processor, a memory, a storage, and a communication device, for example, in the same manner as the conveyance controller 41, the ceiling conveyance vehicle controller 42, and the storage apparatus controller 43.

Upon detecting that a vacancy has occurred in the apparatus port 101 of the semiconductor processing apparatus 100 or the first storage part 31A, for example, the host controller 40 outputs a conveyance request to instruct unload (supply) of a new FOUP 90 to the conveyance controller 41.

Upon detecting that the processed FOUP 90 has appeared on the apparatus port 101 of the semiconductor processing apparatus 100 (that is, that the processing of the semiconductor processing apparatus 100 on the FOUP 90 placed on the apparatus port 101 has been completed), for example, the host controller 40 outputs a conveyance request to instruct grasping (collection) of the processed FOUP 90 to the conveyance controller 41.

Upon receiving the conveyance request from the host controller 40 as exemplified above, the conveyance controller 41 determines which FOUP 90 will be conveyed from location to location based on the conveyance request and generates the conveyance instruction described above. The conveyance controller 41 performs matching on a supply request (a conveyance request to request supply) and a collection request (a conveyance request to request collection) received from the host controller 40 based on a rule programmed in advance to generate a conveyance instruction designating the From point and the To point, for example. The conveyance controller 41 outputs the thus generated conveyance instruction to the ceiling conveyance vehicle controller 42 or the storage apparatus controller 43.

The ceiling conveyance vehicle controller 42 is a single controller controlling the traveling operation of the ceiling conveyance vehicles 20 and, upon receiving the conveyance instruction (the ID, the From point, and the To point) from the conveyance controller 41, allocates the conveyance instruction to a specific ceiling conveyance vehicle 20. Specifically, the ceiling conveyance vehicle controller 42 determines a ceiling conveyance vehicle 20 that is caused to convey the FOUP 90 indicated in the conveyance instruction based on an allocation rule set in advance. The ceiling conveyance vehicle controller 42 then transmits a control signal so as to convey the FOUP 90 to the determined ceiling conveyance vehicle 20. The ceiling conveyance vehicle controller 42 allocates, to a ceiling conveyance vehicle 20 present at a position closest to the From point of a conveyance instruction to be allocated among the ceiling conveyance vehicles 20 to which no conveyance instruction has been currently allocated, the conveyance instruction to be allocated, for example. The ceiling conveyance vehicle controller 42 is also able to allocate, even to a ceiling conveyance vehicle 20 that is executing another conveyance instruction, the ceiling conveyance vehicle 20 that is conveying the FOUP 90 with a point within a certain range of the From point of the conveyance instruction to be allocated as the To point, a conveyance instruction instructing "execution of the conveyance instruction to be allocated after the conveyance instruction currently being executed" (a conveyance instruction reservation).

The ceiling conveyance vehicle 20 to which the conveyance instruction has been allocated starts a traveling operation so as to execute the conveyance processing based on the conveyance instruction. However, the ceiling conveyance vehicle 20 to which the conveyance instruction reservation has been allocated starts a traveling operation so as to execute conveyance processing based on the conveyance instruction reservation after the completion of the conveyance processing based on the conveyance instruction currently being executed. Specifically, the ceiling conveyance vehicle 20 starts traveling toward the From point and, upon reaching the From point, grasps the FOUP 90 identified by the ID of the conveyance instruction. The ceiling conveyance vehicle 20 then starts traveling toward a position indicated by the To point and, upon reaching the position indicated by the To point, unloads the grasped FOUP 90. By such a series of operations, the FOUP 90 identified by the ID of the conveyance instruction is conveyed from the From point to the To point.

Upon receiving the conveyance instruction (the ID, the From point, and the To point) from the conveyance controller 41, the storage apparatus controller 43 transmits a control signal so as to execute the conveyance processing based on the conveyance instruction to the local vehicle 32 of a storage apparatus 30 to be controlled. With this operation, the local vehicle 32 starts a traveling operation so as to execute the conveyance processing based on the conveyance instruction in the same manner as the ceiling conveyance vehicle 20 to which the conveyance instruction has been allocated described above. Specifically, the local vehicle 32 starts traveling toward the From point and, upon reaching the From point, grasps the FOUP 90 identified by the ID of the conveyance instruction. The local vehicle 32 then starts traveling toward a position indicated by the To point and, upon reaching the position indicated by the To point, unloads the grasped FOUP 90.

The storage apparatus controller 43 monitors a vacancy status of the storage part 31 of the storage apparatus 30 to be controlled by a sensor or the like (not illustrated) and successively transmits monitored results to the conveyance controller 41. With this operation, the conveyance controller 41 is able to recognize the vacancy status of the storage part 31 of each of the storage apparatuses 30.

The following describes supplying-and-collecting control by the conveyance controller 41. The conveyance controller 41 executes the supplying-and-collecting control to increase the operating efficiency of the ceiling conveyance vehicles 20 when the FOUP 90 placed on a downstream port (the apparatus port 101 or the second storage part 31B), which is a place capable of accommodating the FOUP 90 thereon, has changed to a state waiting for collection, and when the FOUP 90 is not placed on an upstream port, which is a place that is located on the upstream side of the downstream port and capable of accommodating the FOUP 90 thereon. In the configuration example illustrated in FIG. 1, the upstream port is the first storage part 31A when the downstream port is the apparatus port 101, and the upstream port is the first storage part 31A or the apparatus port 101 when the downstream port is the second storage part 31B.

The supplying-and-collecting control is control to increase the possibility for a supplying-and-collecting operation to be established. The supplying-and-collecting operation is an operation in which any of the ceiling conveyance vehicles 20 that has placed the FOUP 90 to be newly supplied to the semiconductor processing apparatus 100 (a second conveyed object) on the upstream port collects the FOUP 90 waiting for collection (a first conveyed object). In other words, the supplying-and-collecting operation is an operation in which one ceiling conveyance vehicle 20 performs supply and collection of the FOUP 90 to and from the semiconductor processing apparatus 100. Consequently, when the supplying-and-collecting operation is established, the operating efficiency of the ceiling conveyance vehicles 20 is able to be improved compared with a case in which the supplying-and-collecting operation is not established (that is, when two ceiling conveyance vehicles 20 are required for supply and collection of the FOUP 90).

The conveyance controller 41 executes the following operation as the supplying-and-collecting control. The conveyance controller 41 waits without outputting (outputting to the ceiling conveyance vehicle controller 42) of a conveyance instruction (a collection instruction) instructing collection of the FOUP 90 on the downstream port until any of the ceiling conveyance vehicles 20 conveying another FOUP 90 to the upstream port has been recognized until a waiting time set in advance has elapsed since the FOUP 90 on the downstream port changed to the state waiting for collection. In other words, the conveyance controller 41 performs control to delay the timing of outputting the collection instruction for the FOUP 90 waiting for collection until the ceiling conveyance vehicle 20 conveying the other FOUP 90 to the upstream port has been recognized. With this control, the possibility for the supplying-and-collecting operation to be established is increased. The output timing of the collection instruction is thus controlled, such that in allocation processing for the collection instruction by the ceiling conveyance vehicle controller 42, the possibility for the collection instruction to be allocated to the ceiling conveyance vehicle 20 conveying the FOUP 90 to the upstream port is increased. Specifically, the possibility for the collection instruction for the FOUP 90 on the downstream port to be allocated to the ceiling conveyance vehicle 20 conveying the FOUP 90 to the upstream port as the conveyance instruction reservation described above is increased. Such supplying-and-collecting control increases the possibility for the supplying-and-collecting operation to be established and thus improves the operating efficiency of the ceiling conveyance vehicles 20.

When the time during which output of the collection instruction is waited for is prolonged, even if the operating efficiency of the ceiling conveyance vehicles 20 is improved by the supplying-and-collecting operation that has been established, the efficiency of conveying the FOUP 90 in the entire conveyance system 1 may degrade. Given these circumstances, when a waiting time set in advance has elapsed since the FOUP 90 on the downstream port changed to the state waiting for collection, the conveyance controller 41 outputs the collection instruction for the FOUP 90 to the ceiling conveyance vehicle controller 42. In other words, when the ceiling conveyance vehicle 20 conveying the FOUP 90 to the upstream port has not been recognized even when waiting for a certain time since the FOUP 90 waiting for collection occurred, the conveyance controller 41 cancels the wait for output of the collection instruction to output the collection instruction. The waiting time which is acceptable delay of the timing of outputting the collection instruction is thus set in advance, and the collection instruction is immediately output when the waiting time has elapsed. As a result, degradation in the efficiency of conveying the FOUP 90 is significantly reduced or prevented.

Figure 4:
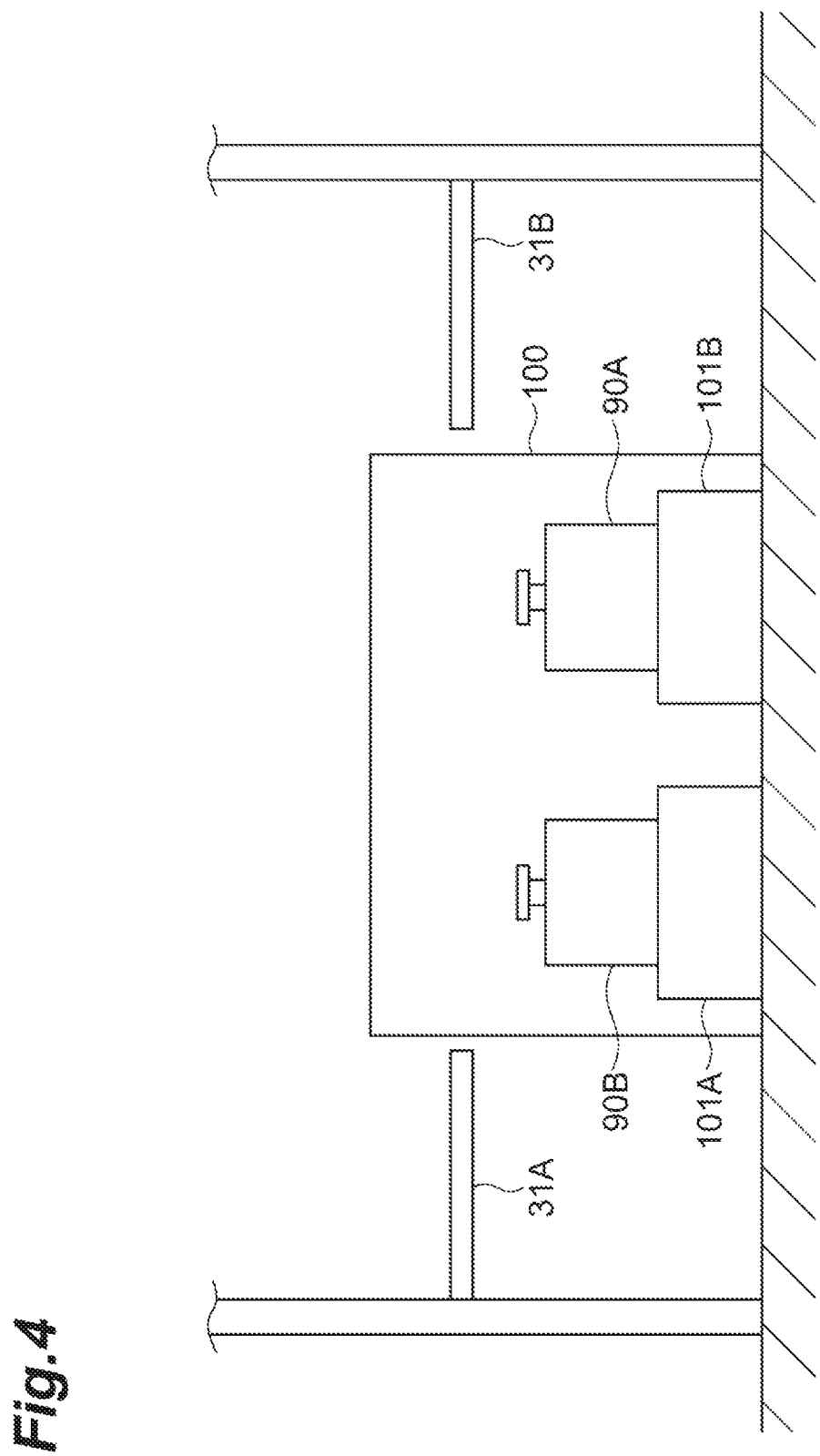
FIG. 4 is a diagram for illustrating an example of a supplying-and-collecting operation.

The following describes a specific example of the supplying-and-collecting control with reference to FIG. 4 to FIG. 9. FIG. 4 illustrates an initial state of the example. In the initial state, a FOUP 90A (the first conveyed object) is placed on an apparatus port 101B on the downstream side among the two apparatus ports 101 of the semiconductor processing apparatus 100. A FOUP 90B is placed on an apparatus port 101A on the upstream side. Upon completing the processing by the semiconductor processing apparatus 100 on the FOUP 90A, the conveyance controller 41 receives a collection request for the FOUP 90A from the host controller 40 described above.

Figure 5:
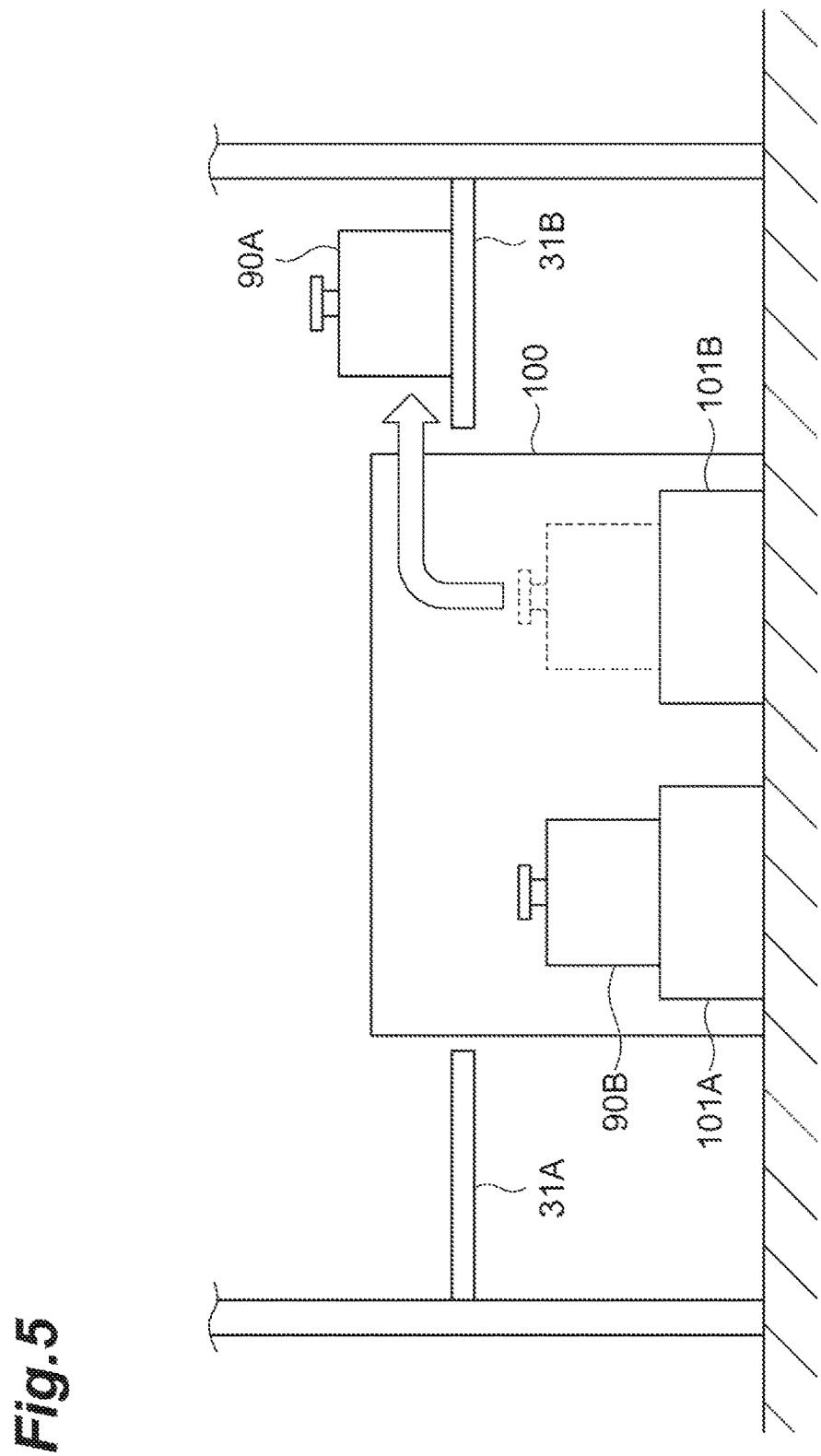
FIG. 5 is a diagram for illustrating the example of the supplying-and-collecting operation.

In this process, the conveyance controller 41 recognizes that the second storage part 31B is vacant through communication with the storage apparatus controller 43. When the downstream port (the second storage part 31B in this example) is thus vacant, and when the FOUP 90A to be collected is placed on the upstream port (the apparatus port 101B in this example), the conveyance controller 41 transfers the FOUP 90A to the downstream port. Specifically, the conveyance controller 41 outputs a conveyance instruction instructing transfer of the FOUP 90A to the second storage part 31B to the local vehicle 32 via the storage apparatus controller 43. With this operation, as illustrated in FIG. 5, the FOUP 90A is transferred to the second storage part 31B by the local vehicle 32 to become a state waiting for collection on the second storage part 31B. This transfer operation makes the apparatus port 101B vacant, resulting in a state in which the FOUP 90 is not placed on the first storage part 31A and the apparatus port 101B on the upstream side of the second storage part 31B as the downstream port. In other words, a state in which the supplying-and-collecting operation described above is able to be executed is established.

In this case, the conveyance controller 41 detects that the FOUP 90A is not placed on the apparatus port 101B on the upstream side of the second storage part 31B on which the FOUP 90A waiting for collection is placed, and then the conveyance controller 41 executes the supplying-and-collecting control described above. Specifically, the conveyance controller 41 waits without outputting a collection instruction instructing collection of the FOUP 90A until any of the ceiling conveyance vehicles 20 conveying a new FOUP 90 to the upstream port (the first storage part 31A or the apparatus port 101B in the example in FIG. 5) has been recognized until a waiting time set in advance has elapsed since the FOUP 90A was placed on the second storage part 31B (that is, since the FOUP 90A changed to the state waiting for collection). The following describes an example of the waiting time described above.

When not receiving a conveyance request to instruct conveyance (supply) of the FOUP 90 (the second conveyed object) to the upstream port (hereinafter referred to as an "upstream conveyance request") from the host controller 40 by the time a waiting time T1 (a first waiting time) set in advance has elapsed since the FOUP 90A changed to the state waiting for collection, the conveyance controller 41 outputs the collection instruction for the FOUP 90A. The conveyance controller 41 starts up a first timer when the FOUP 90A has changed to the state waiting for collection and, when not receiving the upstream conveyance request by the time the waiting time T1 has elapsed since the first timer was started up, outputs the collection instruction for the FOUP 90A, for example.

The waiting time T1 is based on the following. Specifically, when the time until the conveyance controller 41 has received the upstream conveyance request from the host controller 40 is prolonged, the time for the ceiling conveyance vehicle 20 that is able to execute the supplying-and-collecting operation to collect the FOUP 90A is also delayed accordingly. Consequently, the control described above is performed with the time until the upstream conveyance request has been received since the FOUP 90A changed to the state waiting for collection as an indicator, such that degradation in conveyance efficiency caused by continuation of waiting without outputting the collection instruction is able to be appropriately reduced or prevented.

In contrast, when receiving the upstream conveyance request by the time the waiting time T1 has elapsed since the FOUP 90A changed to the state waiting for collection, the conveyance controller 41 executes the following control. The following considers a case in which conveyance of a FOUP 90C to the apparatus port 101B is executed based on the upstream conveyance request as an example. When the FOUP 90C has not changed to a conveyance state to be conveyed by any of the ceiling conveyance vehicles 20 by the time a waiting time T2 (a second waiting time) set in advance has elapsed since the upstream conveyance instruction was received from the host controller 40, the conveyance controller 41 outputs the collection instruction for the FOUP 90A. The conveyance controller 41 starts up a second timer when receiving the upstream conveyance request and, when the FOUP 90C as an object to be conveyed of a conveyance instruction generated based on the upstream conveyance request has not changed to the conveyance state by the time the waiting time T2 has elapsed since the second timer was started up, outputs the collection instruction for the FOUP 90A, for example. Whether the FOUP 90C has changed to the conveyance state (that is, whether any of the ceiling conveyance vehicles 20 conveying the FOUP 90C has been recognized) is recognized by the ceiling conveyance vehicle controller 42 controlling the traveling operation of the ceiling conveyance vehicles 20, for example. Consequently, the conveyance controller 41 receives a notification from the ceiling conveyance vehicle controller 42 and thus recognizes whether the FOUP 90C has changed to the conveyance state, for example.

After the conveyance controller 41 receives the upstream conveyance request, in a period of time until the FOUP 90C has changed to the conveyance state to be conveyed by the ceiling conveyance vehicle 20, the following processing is executed, for example. Specifically, upon receiving the upstream conveyance request from the host controller 40, the conveyance controller 41 generates a conveyance instruction based on the upstream conveyance request (a conveyance instruction instructing conveyance of the FOUP 90C to the apparatus port 101B in the above example) and outputs the conveyance instruction to the ceiling conveyance vehicle controller 42. Next, the ceiling conveyance vehicle controller 42 allocates the conveyance instruction to a specific ceiling conveyance vehicle 20. Subsequently, the ceiling conveyance vehicle 20 to which the conveyance instruction has been allocated starts traveling toward a grasping position for the FOUP 90C to be conveyed (the From point of the conveyance instruction). When the ceiling conveyance vehicle 20 reaches the grasping position for the FOUP 90C and completes grasping of the FOUP 90C, a state in which the FOUP 90C is able to be conveyed (that is, the conveyance state) is established.

The waiting time T2 is based on the following. Specifically, when the time until the FOUP 90C has changed to the conveyance state since the conveyance controller 41 received the upstream conveyance request from the host controller 40 is prolonged, the time for the ceiling conveyance vehicle 20 that is able to execute the supplying-and-collecting operation to collect the FOUP 90A is also delayed accordingly. Consequently, the control described above is performed with the time until the FOUP 90C has changed to the conveyance state since the upstream conveyance request was received from the host controller 40 as an indicator, such that degradation in conveyance efficiency caused by continuation of waiting without outputting the collection instruction is appropriately reduced or prevented.

Figure 6:
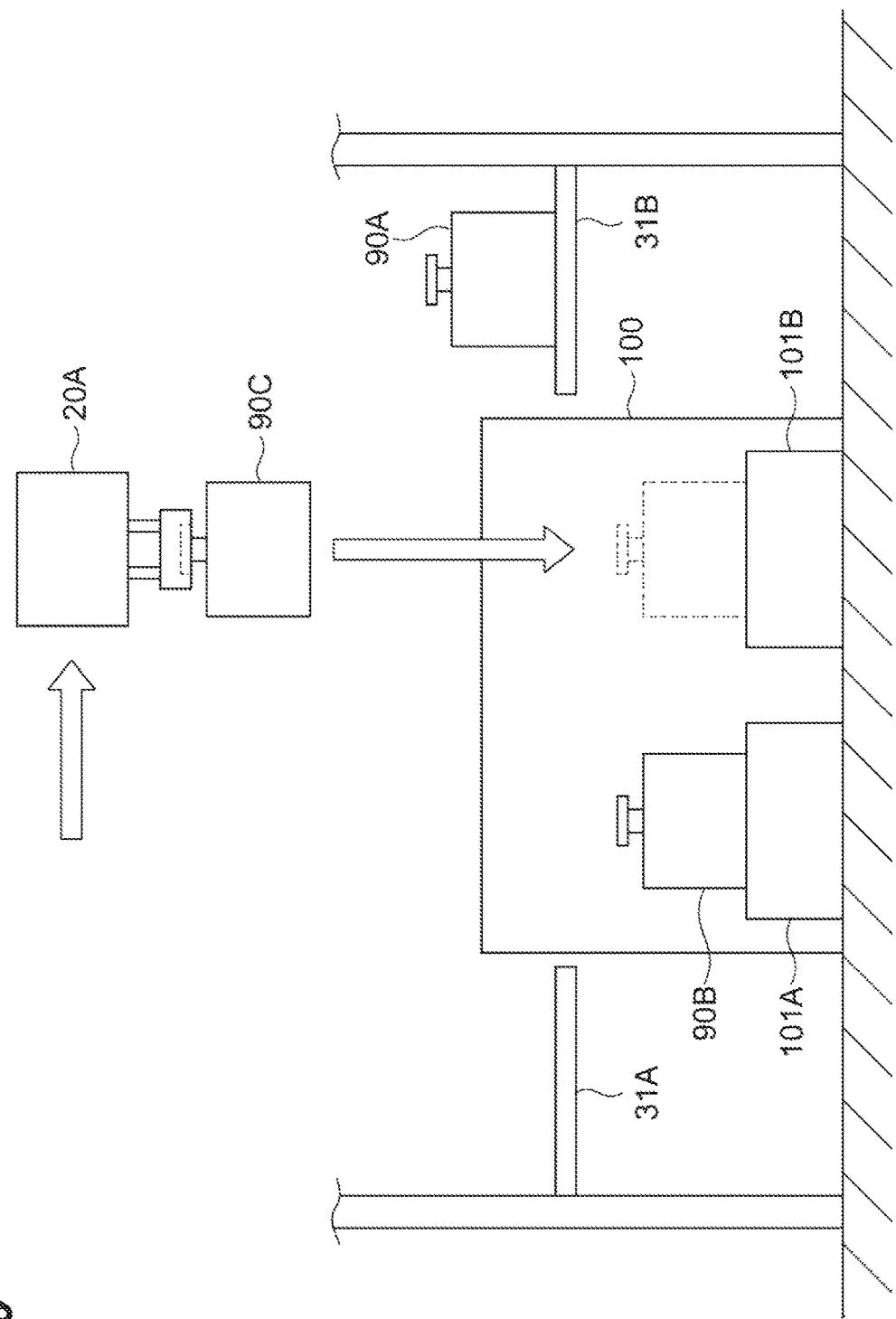
FIG. 6 is a diagram for illustrating the example of the supplying-and-collecting operation.
Figure 7:
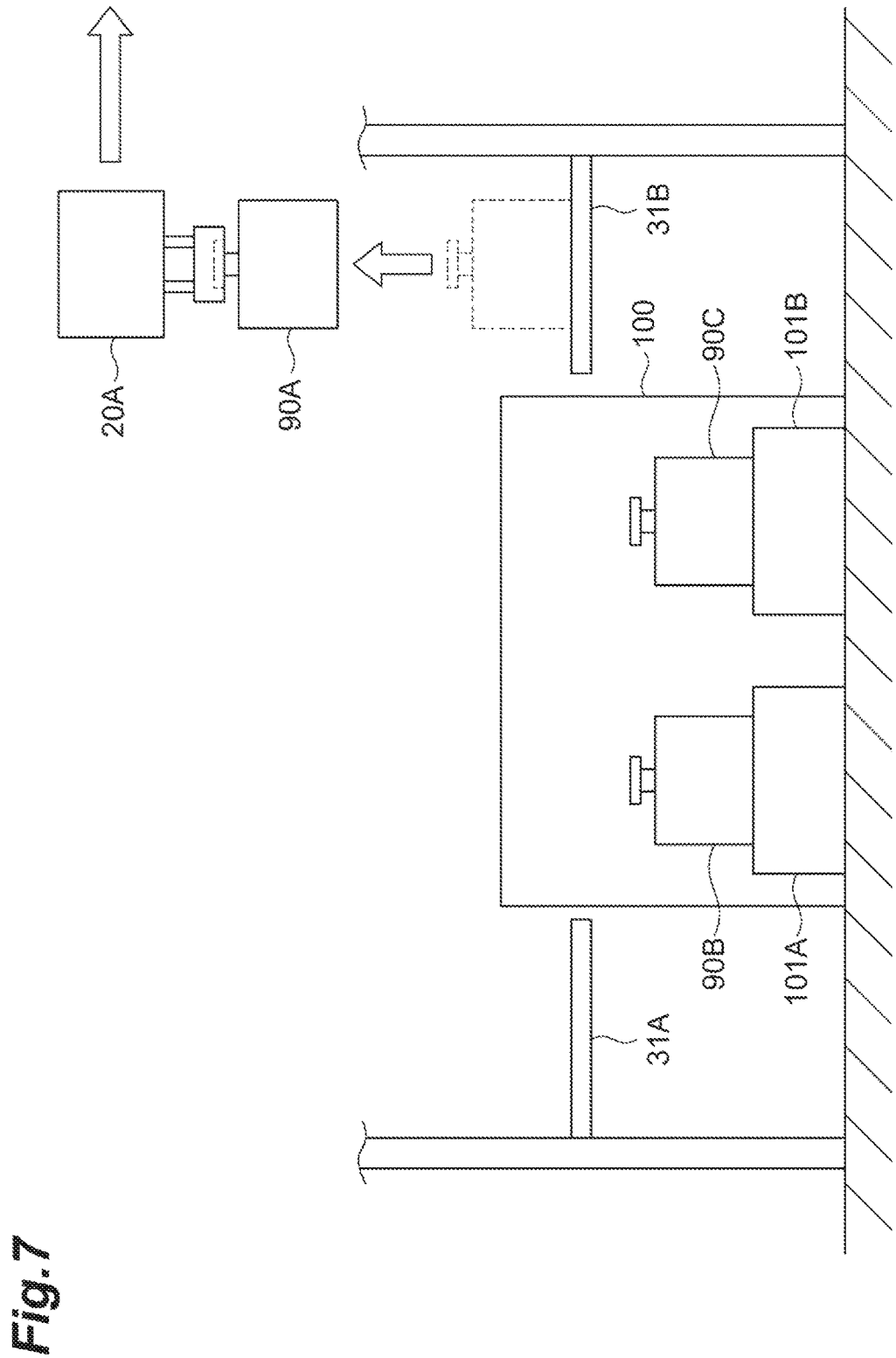
FIG. 7 is a diagram for illustrating the example of the supplying-and-collecting operation.

In contrast, when the FOUP 90C has changed to the conveyance state to be conveyed by the ceiling conveyance vehicle 20 by the time the waiting time T2 has elapsed since the upstream conveyance instruction was received, the conveyance controller 41 recognizes that the ceiling conveyance vehicle 20 conveying the new FOUP 90C has been recognized by the time the waiting time set in advance has elapsed, and outputs the collection instruction for the FOUP 90A. With this operation, as illustrated in FIG. 6 and FIG. 7, the possibility for the supplying-and-collecting operation to collect the FOUP 90A on the second storage part 31B by the ceiling conveyance vehicle (a ceiling conveyance vehicle 20A in FIG. 6 and FIG. 7) that has placed the FOUP 90C on the apparatus port 101B to be established is increased.

In the example described above, conveyance of the FOUP 90C to the apparatus port 101B is executed based on the upstream conveyance request, and the supplying-and-collecting control similar to the one described above is also enabled when conveyance of the FOUP 90C to the first storage part 31A is executed based on the upstream conveyance request. In this case, the possibility for the supplying-and-collecting operation to collect the FOUP 90A on the second storage part 31B by the ceiling conveyance vehicle 20 that has placed the new FOUP 90C on the first storage part 31A to be established is increased.

Figure 8:
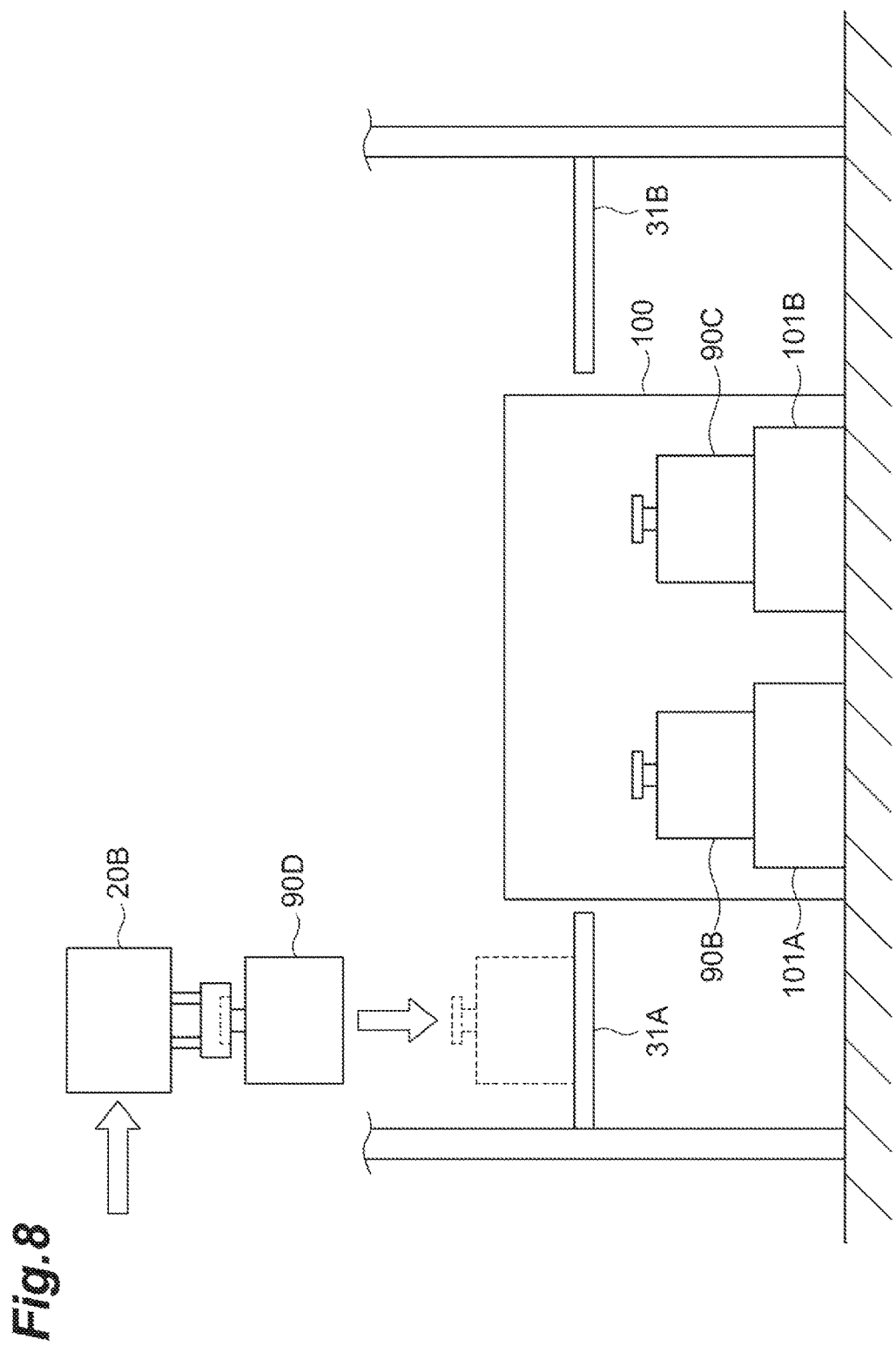
FIG. 8 is a diagram for illustrating an example of the supplying-and-collecting operation.
Figure 9:
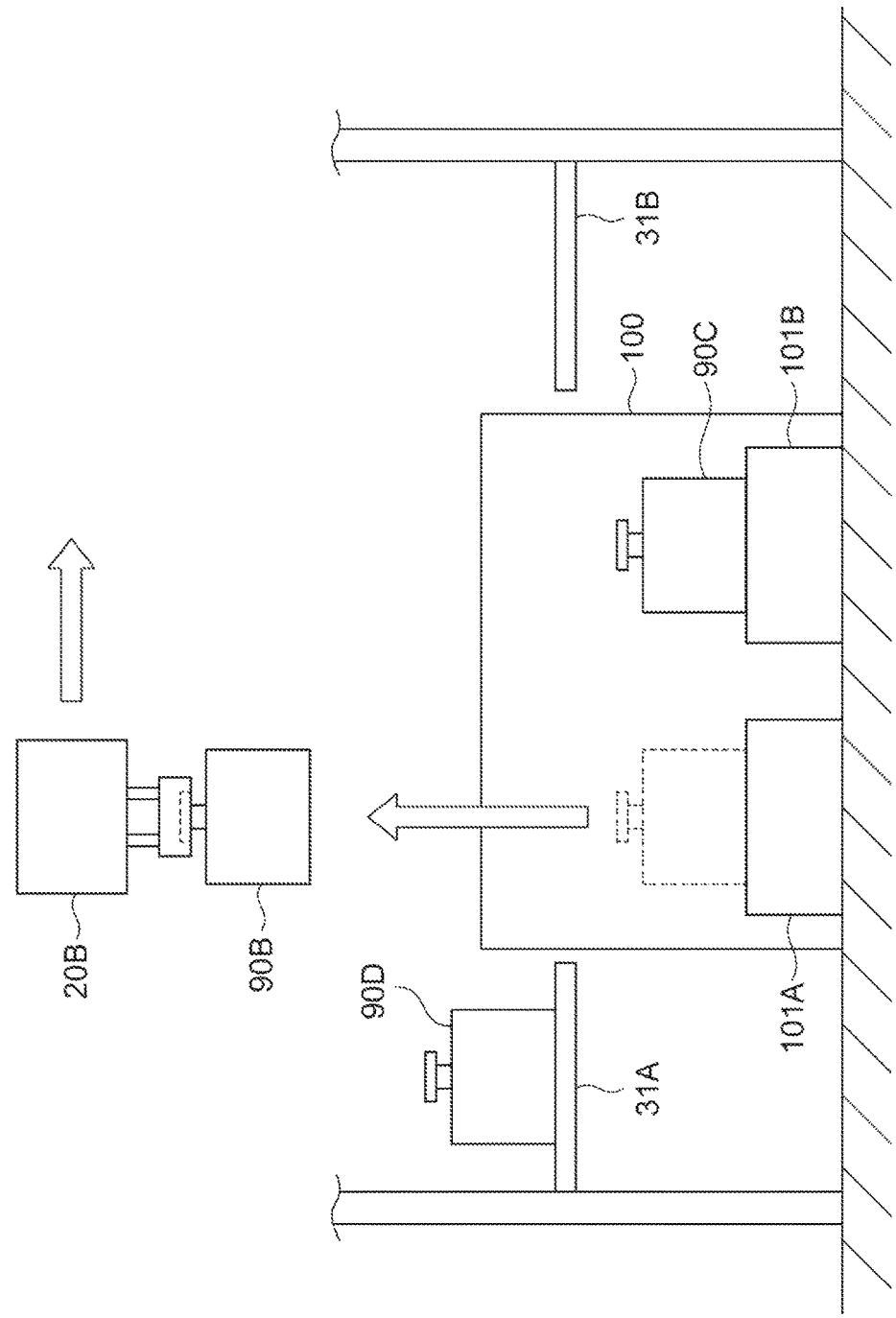
FIG. 9 is a diagram for illustrating the example of the supplying-and-collecting operation.

As illustrated in FIG. 8 and FIG. 9, the supplying-and-collecting control similar to the one described above is also able to be executed when any of the ceiling conveyance vehicles 20 is caused to directly collect the FOUP 90B placed on the apparatus port 101A (that is, when the FOUP 90B is not once transferred to the second storage part 31B). In this case, the supplying-and-collecting control similar to the one described above is able to be executed with a point in time when the conveyance controller 41 has received a collection request for the FOUP 90B from the host controller 40 as a point in time when the FOUP 90B has changed to the state waiting for collection. With such supplying-and-collecting control, the possibility for the supplying-and-collecting operation to collect the FOUP 90B on the apparatus port 101A by a ceiling conveyance vehicle 20B that has placed a new FOUP 90D on the first storage part 31A to be established is increased.

By executing the supplying-and-collecting control described above, the possibility for the supplying-and-collecting operation to be established is increased while reducing or preventing degradation in conveyance efficiency caused by a delay in collection timing for the FOUP 90 waiting for collection, such that the operating efficiency of the ceiling conveyance vehicles 20 is increased. However, depending on the type of the FOUP 90 waiting for collection, for example, a case may occur that the collection instruction should be immediately output without executing the supplying-and-collecting control described above (waiting without outputting the collection instruction). Given these circumstances, the conveyance controller 41 preferably refrains from executing the supplying-and-collecting control described above when the FOUP 90 satisfying certain exclusion conditions described below is an object to be collected.

When a degree of priority of conveyance of the FOUP 90 (the FOUP 90A or the FOUP 90B in the example in FIG. 4 to FIG. 9) is higher than a standard set in advance, the conveyance controller 41 may output the collection instruction for the FOUP 90 at a point in time when the FOUP 90 has changed to the state waiting for collection, for example. When information on the degree of priority is incorporated into the conveyance request from the host controller 40, the conveyance controller 41 is able to recognize the degree of priority of the FOUP 90 to be collected, for example. For such a degree of priority, stepped values set in advance such as "1: low priority," "2: middle priority," and "3: high priority" are able to be used, for example. When the degree of priority of the FOUP 90 to be collected is higher (when the degree of priority is "3" in this case) than the standard set in advance (between "2" and "3," for example), the conveyance controller 41 outputs the collection instruction for the FOUP 90 immediately at a point in time when the FOUP 90 has changed to the state waiting for collection.

For the FOUP 90 storing a semiconductor wafer as a trial product to verify whether a series of processing by each of the semiconductor processing apparatuses 100 is properly executed (hereinafter, a "trial product FOUP"), inter-process conveyance is preferably performed in preference to other FOUPs 90 in order to quickly know a verification result, for example. Given these circumstances, the degree of priority of such a trial product FOUP is set to "3" described above, such that the trial product FOUP is able to be excluded from execution of the supplying-and-collecting control. With this operation, collection timing for the trial product FOUP is prevented from being delayed by the supplying-and-collecting control.

When a next conveyance destination of the FOUP 90 (the FOUP 90A or the FOUP 90B in the example in FIG. 4 to FIG. 9) is a specific conveyance destination set in advance, the conveyance controller 41 may output the collection instruction for the FOUP 90 at a point in time when the FOUP 90 has changed to the state waiting for collection. When the next conveyance destination is a stocker or the like for temporarily storing the FOUP 90, there is not much need to hasten conveyance of the FOUP 90, for example. In contrast, when the next conveyance destination is the semiconductor processing apparatus 100 (the apparatus port 101 of the semiconductor processing apparatus 100), conveyance of the FOUP 90 may be preferably hastened. When a chemical change of semiconductor wafers by the processing by one semiconductor processing apparatus 100 is fast, for example, processing at the next process is required to be executed within a certain period after the end of the processing by the one semiconductor processing apparatus 100. Given these circumstances, the apparatus port 101 of the semiconductor processing apparatus 100 for which commencement of the processing is required to be hastened is set as the specific conveyance destination described above, such that the FOUP 90 to be conveyed to the apparatus port 101 is excluded from the execution of the supplying-and-collecting control, and the FOUP 90 is able to be immediately conveyed to the next conveyance destination.

In the conveyance system 1 configured as described above, a conveyance method as illustrated in FIG. 10 as an example is preferably performed by the conveyance controller 41. The description of the conveyance method illustrated in FIG. 10 refers to a FOUP to be collected as a "first FOUP" and refers to a FOUP to be newly supplied as a "second FOUP." In the example in FIG. 4 to FIG. 7, the FOUP 90A corresponds to the first FOUP, whereas the FOUP 90C corresponds to the second FOUP. In the example in FIG. 8 and FIG. 9, the FOUP 90B corresponds to the first FOUP, whereas the FOUP 90D corresponds to the second FOUP.

First, the conveyance controller 41 detects that the first FOUP placed on the downstream port (the second storage part 31B in the example in FIG. 4 to FIG. 7 or the apparatus port 101A in the example in FIG. 8 and FIG. 9) has changed to a state waiting for collection (Step S1, a first step). Specifically, the conveyance controller 41 is able to detect whether the first FOUP is in the state waiting for collection depending on whether a collection request for the first FOUP has been received from the host controller 40.

Next, the conveyance controller 41 determines whether the first FOUP is to be excluded from the supplying-and-collecting control (Step S2). Specifically, as described above, the conveyance controller 41 is able to determine whether the first FOUP is excluded from the execution of the supplying-and-collecting control based on the degree of priority or the conveyance destination of conveyance of the first FOUP. If it is determined that the first FOUP is to be excluded from the supplying-and-collecting control (Yes at Step S2), the conveyance controller 41 outputs a collection instruction for the first FOUP (Step S10) without executing the supplying-and-collecting control (Steps S4 to S9).

In contrast, if it is determined that the first FOUP is not to be excluded from the supplying-and-collecting control (No at Step S2), the conveyance controller 41 determines whether the upstream port (the first storage part 31A or the apparatus port 101B in the example in FIG. 4 to FIG. 7 or the first storage part 31A in the example in FIG. 8 and FIG. 9) is vacant (that is, whether the FOUP 90 is placed thereon) (Step S3, a second step). If it is determined that the upstream port is not vacant (No at Step S3), the status does not enable the supplying-and-collecting control to be established, and the conveyance controller 41 outputs the collection instruction for the first FOUP (Step S10) without executing the supplying-and-collecting control (Steps S4 to S9).

In contrast, if it is determined that the upstream port is vacant (Yes at Step S3), the status enables the supplying-and-collecting control to be established, and the conveyance controller 41 executes the supplying-and-collecting control (Steps S4 to S9, a third step). First, the conveyance controller 41 starts up the first timer (Step S4). The conveyance controller 41 monitors whether a conveyance request to instruct conveyance of the second FOUP to the upstream port (the upstream conveyance request) has been received from the host controller 40 until the waiting time T1 has elapsed since the first timer was started up (Steps S5 and S6). If the upstream conveyance request has not been received by the time the waiting time T1 has elapsed since the first timer was started up (Yes at Step S6), the conveyance controller 41 outputs the collection instruction for the first FOUP (Step S10) in order to significantly reduce or prevent degradation in conveyance efficiency caused by a delay in collection timing for the first FOUP.

In contrast, if the upstream conveyance request has been received by the time the waiting time T1 has elapsed since the first timer was started up (Yes at Step S5), the conveyance controller 41 starts up the second timer (Step S7). At a point in time when the conveyance controller 41 has received the upstream conveyance request, the second FOUP has not been specifically identified. The second FOUP is specifically identified at a point in time when the conveyance controller 41 has generated a conveyance instruction based on the upstream conveyance request. As described above, the FOUP 90C is the second FOUP in the example in FIG. 4 to FIG. 7, whereas the FOUP 90D is the second FOUP in the example in FIG. 8 and FIG. 9. The conveyance controller 41 monitors whether the second FOUP as an object to be conveyed of the conveyance instruction generated based on the upstream conveyance request has changed to the conveyance state until the waiting time T2 has elapsed since the second timer was started up (Steps S8 and S9). If the second FOUP has not changed to the conveyance state by the time the waiting time T2 has elapsed since the second timer was started up (Yes at Step S9), the conveyance controller 41 outputs the collection instruction for the first FOUP (Step S10) in order to significantly reduce or prevent degradation in conveyance efficiency caused by a delay in collection timing for the first FOUP.

In contrast, if the second FOUP has changed to the conveyance state by the time the waiting time T2 has elapsed since the second timer was started up (Yes at Step S8), the conveyance controller 41 recognizes that the ceiling conveyance vehicle 20 conveying the second FOUP has been recognized by the time the waiting time set in advance has elapsed, and outputs the collection instruction for the first FOUP (Step S10).

As described above, in the conveyance system 1, the conveyance controller 41 waits without outputting the conveyance instruction (the collection instruction) instructing collection of the first FOUP in the state waiting for collection on the downstream port until the ceiling conveyance vehicle 20 conveying the second FOUP to the upstream port has been recognized within the waiting time set in advance. The collection instruction for the first FOUP is thus output after the ceiling conveyance vehicle 20 conveying the second FOUP to the upstream port has been recognized, such that the possibility for the collection instruction for the first FOUP to be allocated to the ceiling conveyance vehicle 20 conveying the second FOUP is increased. Consequently, the possibility for the supplying-and-collecting operation that collects the first FOUP by the ceiling conveyance vehicle 20 that has placed the second FOUP on the upstream port to be established is increased. In addition, the waiting time during which output of the collection instruction can be waited for is set in advance, such that degradation in conveyance efficiency caused by continuation of waiting without outputting the collection instruction is able to be significantly reduced or prevented. Consequently, the conveyance system 1 increases the possibility for the supplying-and-collecting operation to be established while reducing or preventing degradation in conveyance efficiency and thus improves the operating efficiency of the ceiling conveyance vehicles 20.

In the conveyance system 1, when the time until the conveyance request to instruct conveyance of the second FOUP to the upstream port has been received since the first FOUP changed to the state waiting for collection exceeds the waiting time T1, the collection instruction is output. With this operation, degradation in conveyance efficiency caused by continuation of waiting without outputting the collection instruction is appropriately reduced or prevented.

In the conveyance system 1, when the time until the second FOUP has changed to the conveyance state since the conveyance request to instruct conveyance of the second FOUP to the upstream port was received from the host controller 40 exceeds the waiting time T2, the collection instruction is output. With this operation, degradation in conveyance efficiency caused by continuation of waiting without outputting the collection instruction is appropriately reduced or prevented.

In the conveyance system 1, transfer of the FOUP 90 from the upstream port (the first storage part 31A or the apparatus port 101) to the downstream port (the apparatus port 101 or the second storage part 31B) is performed by the local vehicle 32, such that a situation that enables the supplying-and-collecting operation to be executed is able to be intentionally created.

In the conveyance system 1, when the degree of priority of conveyance of the first FOUP is higher than the standard set in advance, the conveyance controller 41 outputs the collection instruction for the first FOUP at the point in time when the first FOUP has changed to the state waiting for collection. With this operation, the FOUP 90 with a high degree of priority of conveyance is excluded from the execution of the supplying-and-collecting control and is able to be immediately conveyed. With this operation, the supplying-and-collecting control is able to be appropriately executed while requirements for the first FOUP are satisfied.

In the conveyance system 1, when the next conveyance destination of the first FOUP is the specific conveyance destination set in advance, the conveyance controller 41 outputs the collection instruction for the first FOUP at the point in time when the first FOUP has changed to the state waiting for collection. With this operation, a conveyance destination for which commencement of processing is required to be hastened such as an apparatus port of a specific semiconductor processing apparatus is set as the specific conveyance destination, such that the conveyed object with such a specific conveyance destination as the next conveyance destination is excluded from the execution of the supplying-and-collecting control and is able to be immediately conveyed. With this operation, the supplying-and-collecting control is able to be appropriately executed while requirements for the first conveyed object are satisfied.

Although preferred embodiments of the present invention have been described, the present invention is not limited thereto. The configuration of the storage apparatus 30 illustrated in FIG. 1 and FIG. 2 is by way of example only, and the arrangement and configuration of the storage part 31 and the local vehicle 32 can be freely designed, for example. In addition, the number of the apparatus ports 101 provided in one semiconductor processing apparatus 100 is not limited to two exemplified in the preferred embodiments, and may be one or three or more. Further, the number of the storage parts 31 provided in one storage apparatus 30 is also not limited to two, and may be one or three or more.

The control configuration illustrated in FIG. 3 is by way of example, and the control system of the controllers is not necessarily required to match the hierarchical structure illustrated in FIG. 3. The storage apparatus controller 43 for each of the storage apparatuses 30 may be a single controller common to the storage apparatuses 30, for example. Similarly, the conveyance controller 41, the ceiling conveyance vehicle controller 42, and the storage apparatus controller 43 may be a single controller.

The conveyed object that the conveyance systems according to preferred embodiments of the present invention convey is not limited to the FOUP housing a plurality of semiconductor wafers and may be another container housing glass wafers, reticles, or the like. The conveyance systems according to preferred embodiments of the present invention are not limited to semiconductor manufacturing factories, but can be used also for other facilities. The conveyance vehicles conveying the conveyed object in the conveyance system according to preferred embodiments of the present invention are not limited to the ceiling conveyance vehicle and may be a conveyance vehicle that travels on a track with the FOUP placed thereon to convey the FOUP or an unmanned traveling vehicle that conveys the FOUP along a path provided on a floor, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A conveyance system comprising:
a track;
a plurality of conveyance vehicles traveling along the track and each conveying a conveyed object; and
a controller configured or programmed to output a conveyance instruction for the conveyed object to the plurality of conveyance vehicles, wherein
when a first conveyed object placed on a downstream port, which is a place capable of accommodating the conveyed object thereon, is in a state waiting for collection, and when the conveyed object is not placed on an upstream port, which is on an upstream side of the downstream port in a travel direction of the conveyance vehicles and capable of accommodating the conveyed object thereon, the controller is configured or programmed to:
wait without outputting a conveyance instruction instructing collection of the first conveyed object until any of the conveyance vehicles conveying a second conveyed object to the upstream port has been recognized until a waiting time set in advance has elapsed since the first conveyed object changed to the state waiting for collection; and
output the conveyance instruction instructing collection of the first conveyed object when the waiting time has elapsed since a point in time when the first conveyed object changed to the state waiting for collection.

2. The conveyance system according to claim 1, wherein the controller is configured or programmed to output the conveyance instruction for the conveyed object based on a conveyance request for the conveyed object received from a host controller, and
the controller outputs the conveyance instruction instructing collection of the first conveyed object when not receiving a conveyance request to instruct conveyance of the second conveyed object to the upstream port from the host controller by the time a first waiting time set in advance has elapsed since the first conveyed object changed to the state waiting for collection.

3. The conveyance system according to claim 2, wherein the controller outputs the conveyance instruction instructing collection of the first conveyed object when the second conveyed object has not changed to a conveyance state to be conveyed by any of the conveyance vehicles by the time a second waiting time set in advance has elapsed since the conveyance request to instruct conveyance of the second conveyed object to the upstream port was received from the host controller.

4. The conveyance system according to claim 1, further comprising a storage apparatus including a storage plate to and from which any of the conveyance vehicles is capable of delivering the conveyed object and a local vehicle capable of transferring the conveyed object between the storage plate and an apparatus port to and from which any of the conveyance vehicles is capable of delivering the conveyed object, wherein
the storage plate includes a first storage plate provided on an upstream side of the apparatus port in the travel direction of the conveyance vehicles and a second storage plate provided on a downstream side of the apparatus port in the travel direction of the conveyance vehicles;
the downstream port is the apparatus port or the second storage plate;
the upstream port is the first storage plate when the downstream port is the apparatus port and is the first storage plate or the apparatus port when the downstream port is the second storage plate; and
the controller is configured or programmed to further output a conveyance instruction for the conveyed object to the local vehicle to output a conveyance instruction instructing transfer of the first conveyed object to the downstream port to the local vehicle when the downstream port is vacant, and when the first conveyed object is placed on the upstream port.

5. The conveyance system according to claim 1, wherein when a degree of priority of conveyance of the first conveyed object is higher than a standard set in advance, the controller outputs the conveyance instruction instructing collection of the first conveyed object at a point in time when the first conveyed object has changed to the state waiting for collection.

6. The conveyance system according to claim 1, wherein when a next conveyance destination of the first conveyed object is a specific conveyance destination set in advance, the controller outputs the conveyance instruction instructing collection of the first conveyed object at a point in time when the first conveyed object has changed to the state waiting for collection.

7. A conveyance method performed by the controller in the conveyance system according to claim 1, the conveyance method comprising:
detecting that the first conveyed object placed on the downstream port has changed to the state waiting for collection;
when it is detected that the first conveyed object has changed to the state waiting for collection at the first step, determining whether the conveyed object is placed on the upstream port; and
when it is determined that the conveyed object is not placed on the upstream port at the second step, waiting without outputting the conveyance instruction instructing collection of the first conveyed object until the conveyance vehicle conveying the second conveyed object to the upstream port has been recognized until the waiting time set in advance has elapsed since the first conveyed object changed to the state waiting for collection and outputting the conveyance instruction instructing collection of the first conveyed object when the waiting time has elapsed since the point in time when the first conveyed object changed to the state waiting for collection.

* * * * *